United States Patent [19]

Schachner et al.

[11] Patent Number: 5,272,009
[45] Date of Patent: Dec. 21, 1993

[54] LAMINATE MATERIAL AND ITS USE AS HEAT-SINK

[75] Inventors: Herbert Schachner, Grand-Lancy, Switzerland; Gérard Horlaville, Reignier, France

[73] Assignee: Battelle Memorial Institute, Carouge/Ge, Switzerland

[21] Appl. No.: 860,282

[22] Filed: Mar. 27, 1992

Related U.S. Application Data

[63] Continuation of Ser. No. 422,890, Oct. 18, 1989, abandoned.

[30] Foreign Application Priority Data

Oct. 21, 1988 [CH] Switzerland ............. 3931/88

[51] Int. Cl.⁵ .............................................. B32B 9/04
[52] U.S. Cl. ................................. 428/408; 174/258; 428/446; 428/698; 428/699; 428/901
[58] Field of Search ........... 428/408, 698, 699, 901, 428/446; 174/68.5, 258

[56] References Cited

U.S. PATENT DOCUMENTS

| | | | |
|---|---|---|---|
| 4,585,706 | 4/1986 | Takeda et al. | 428/698 |
| 4,591,537 | 5/1986 | Aldinger et al. | 428/698 |
| 4,636,434 | 1/1987 | Okamura et al. | 428/408 |
| 4,643,950 | 2/1987 | Ogura et al. | 428/698 |
| 4,659,611 | 4/1987 | Iwase et al. | 428/699 |
| 4,725,345 | 2/1988 | Sakamoto et al. | 428/408 |
| 4,770,953 | 9/1988 | Horiguchi et al. | 428/901 |
| 4,783,368 | 11/1988 | Yamamoto et al. | 428/408 |
| 4,810,563 | 3/1989 | DeGree et al. | 174/68.5 |
| 4,818,626 | 4/1989 | Werdecker et al. | 428/901 |
| 4,849,290 | 7/1989 | Fujimori et al. | 428/408 |
| 4,900,628 | 2/1990 | Ikegaya et al. | 428/408 |

FOREIGN PATENT DOCUMENTS

| | | |
|---|---|---|
| 221531 | 5/1987 | European Pat. Off. . |
| 282075 | 8/1988 | European Pat. Off. . |
| 3709200 | 9/1988 | Fed. Rep. of Germany . |
| 1106494 | 5/1986 | Japan . |
| 2176838 | 8/1987 | Japan . |
| 2198371 | 8/1987 | Japan . |
| 0117093 | 5/1989 | Japan . |
| 0155685 | 6/1989 | Japan . |
| 1-162770 | 6/1989 | Japan . |

OTHER PUBLICATIONS

Badziar et al., "Crystallization of Diamond Crystals and Films by Microwave Assisted CVD (Part II)", Mat. Res. Bull., vol. 23, pp. 531-548, 1988.
Chemical Abstracts, vol. 107, No. 10, Sep. 1987, (Columbus, Ohio, U.S.), see p. 306, Abstract 82715b.
Japanese Abstract A-60057993.

Primary Examiner—A. A. Turner
Attorney, Agent, or Firm—Cushman, Darby & Cushman

[57] ABSTRACT

The laminate material comprises a sintered silicon carbide substrate (S) on which there is deposited by CVD a diamond layer in an enclosure (1) fed with 1% methane in hydrogen through a conduit (13), this gas mixture being activated by a hot tantalum filament raised to 2000° C. This layer is thereafter covered, in another enclosure, with an AlN layer formed from a mixture of $H_2 + 2\%$ $AlCl_3$ reacting with a mixture of $H_2 + 1\%$ $NH_3$.

3 Claims, 1 Drawing Sheet

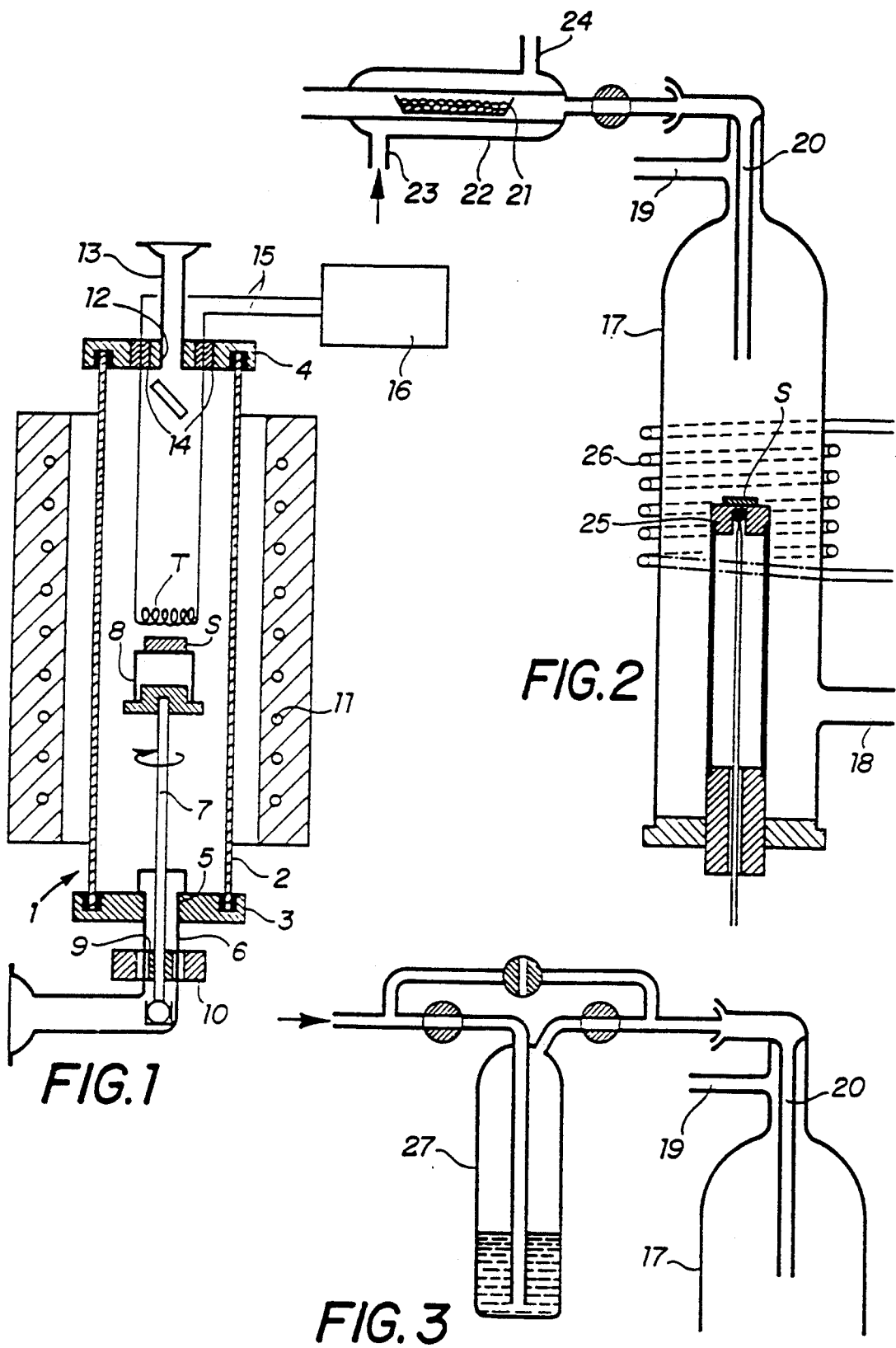

LAMINATE MATERIAL AND ITS USE AS HEAT-SINK

This is a continuation of application Ser. No. 07/422,890, filed on Oct. 18, 1989, now abandoned.

The present invention concerns a laminate material and its use for heat-sinks.

The increase of the density of placement of semi-conductors in integrated circuits which goes together with large scale integration (LSI) requires that heat-sink substrates be used with high thermal conductivity and good electrical insulator properties.

This is why substrates with layers of diamond deposited by CVD (chemical vapor deposition) were proposed already. Since diamond layers cannot be effectively deposited on substrates of all kinds, laminates with alternate diamond and SiC layers have been proposed in EP-A2-221.531. It is known that, in general, SiC is one of the best base substrates to deposit a diamond layer. Since, according to EP-A2-221.531, it is difficult to obtain a thick, uniform diamond layer, it becomes useful to achieve a laminate with alternate SiC and diamond layers.

The impediment of this technique lies in the relatively low thermal conductivity of SiC of 90 W/m.K, i.e. less than about 20 times below that of diamond.

And further to the problems of achieving thick, uniform diamond layers, the deposition rate is generally limited to a few tenth of $\mu$m per hour, hence even if the deposits are uniform, diamond layers are very expensive.

By all these reasons, it is useful to combine diamond and ceramic layers to achieve sufficient thickness and good layer homogeneity at moderate cost.

The object of the present invention is to provide an arrangement to improve the thermal conductibility of the laminate.

Another object of this invention is to provide a laminate material according to claim 1 and the use thereof as heat-sink according to claim 3.

The use of AlN as a ceramic layer is a significant improvement as its thermal conductibility is about twice that of SiC. It was not obvious to use AlN in place of SiC because it is known that although diamond deposits well on SiC, it deposits normally very badly on all substrates containing Al. It was therefore unexpected that AlN will deposit well on diamond. Moreover, the rate of deposition of AlN is about 100 fold faster than that of diamond; hence relatively thick layers with good thermal conductivity can be achieved at moderate price. This is because although the thermal conductibility of AlN is about 10 times inferior to that of diamond, the deposition rate is about 100 times faster.

The annexed drawing illustrates and exemplifies schematically embodiments of reactors for the deposition of layers on substrates in order to achieve a laminate material in conformity with the invention.

BRIEF DESCRIPTION OF THE DRAWINGS

FIG. 1 is a cross-sectional view of a reactor used for diamond deposition.

FIG. 2 is a cross-sectional view of a reactor for AlN deposition.

FIG. 3 is a partial view of a variant of the reactor of FIG. 2.

DESCRIPTION OF THE PREFERRED EMBODIMENTS

The installation illustrated by FIG. 1 comprises a reactor consisting of a cylindrical enclosure 1 whose side wall 2 consists of a SiO$_2$ tube sealingly closed at both ends by brass caps 3 and 4, respectively. Cap 3 comprises a center opening with a pipe 6 for connecting enclosure 1 with a vacuum pump. A vertical rod 7 is rotatingly mounted coaxially in tube 2. On its upper end is a SiO$_2$ carrier 8 for holding a substrate S to be coated. This rod 7 is also provided with a magnetic element 9 in registration with a magnetic drive comprising a ring 10 around tube 6.

The cylindrical portion 2 of enclosure 1 is surrounded by a heating resistor 11. Cap 4 also comprises an axial opening 12 for a pipe 13 to connect the enclosure with a methane and hydrogen source. The cap 4 comprises also two insulators 14, for instance of Teflon®, for insulating two electric wires 15 which supply power to a tantalum filament T from an electric generator 16.

The reactor of FIG. 2 is for depositing an AlN layer; it comprises an enclosure 17 connected on one hand to a vacuum pump (not shown) by a pipe 18 and on the other hand to a source of H$_2$+NH$_3$ by a pipe 19 and to another source of H$_2$ by a pipe 20. This pipe 20 is provided with an AlCl$_3$ supply 21 and a heating mantle 22 with input 23 and output 24 for the heating fluid. A stainless steel carrier 25 for holding substrate S is placed in enclosure 17 which is surrounded by a HF coil 26 to heat the substrate by HF induction.

EXAMPLE 1

In this example a double AlN/diamond couple is deposited on a sintered SiC substrate of density 3.07 g/cm$^3$ and containing (B,C) additives. This sintered substrate is in the form of a disk of diameter 16 mm and 1 mm thick; its surface roughness Ra=0.4 $\mu$m.

For diamond deposition, the SiC disc is laid on carrier 8 of FIG. 1 and the enclosure 1 is fed with 20 cm$^3$/min of H$_2$+1% CH$_4$ through pipe 13. The gas mixture is activated by the not tantalum filament brought to 2000° C. and distant of about 10 mm from the substrate surface which is heated to 840° C. by resistor 11. The pressure inside the reactor is 2 kPa and the deposition duration is 19 hrs. The diamond layer obtained is 5 $\mu$m thick.

The coated substrate is thereafter placed in enclosure 17 shown in FIG. 2 for the deposition of an AlN layer.

A mixture of H$_2$+2% AlCl$_3$ is introduced through pipe 20 at a rate of 100 cm$^3$/min and a mixture of H$_2$+1% NH$_3$ is introduced through pipe 19 at a rate of 400 cm$^3$/min. The substrate is heated to 840° C. with coil 26. The reactor pressure is 6.65 kPa, the operation is carried out for 10 min which results in a 5 $\mu$m layer of AlN over the diamond.

Since it is very difficult to form another layer of diamond on AlN, an intermediate thin layer of SiC is deposited over the AlN layer before applying a new diamond layer as indicated above. For this, there is used a variant of the reactor of FIG. 2 in which (see FIG. 3) the feed pipe 20 is connected to an argon source which is bubbled through a bottle 27 containing liquid dimethylchlor-silane whose vapors are carried by the argon gas; H$_2$ is supplied by pipe 19. The thickness of this layer can be about 0.1 $\mu$m to 5 $\mu$m.

EXAMPLE 2

One deposits a first diamond/AlN pair as in Example 1 and subsequently a layer of SiC under the following conditions.

The total flow through pipe 19 and 20 is 500 cm$^3$/min of a mixture of 0.8% of Me$_2$SiCl$_2$, 5% H$_2$ and 94.2% Ar. The substrate temperature is 1020° C. and the reactor inside pressure 13.3 kPa. The deposition lasts 30 min and the SiC layer is 2 μm thick.

The deposition of diamond and AlN can then be repeated over the thin SiC layer as described in Example 1. And the whole operations can be repeated as many times as desired, each time placing an intermediate thin layer of SiC between the AlN and diamond layers.

We claim:

1. Laminate material comprising in succession a sintered silicon carbide base substrate, a diamond layer and a ceramic layer, characterized in that the ceramic layer is of aluminum nitride.

2. The laminate material of claim 1, characterized in that it further comprises at least another pair of diamond/AlN layers deposited over an intermediate bonding layer of SiC.

3. The method of using a laminate material comprising employing the laminate material of claim 1 in a as heat-sink in integrated circuits manufacture.

* * * * *